(12) United States Patent
Chidambarrao et al.

(10) Patent No.: US 6,881,635 B1
(45) Date of Patent: Apr. 19, 2005

(54) STRAINED SILICON NMOS DEVICES WITH EMBEDDED SOURCE/DRAIN

(75) Inventors: Dureseti Chidambarrao, Weston, CT (US); Effendi Leobandung, Wappingers Falls, NY (US); Anda C. Mocuta, LaGrangeville, NY (US); Haining S. Yang, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/708,746

(22) Filed: Mar. 23, 2004

(51) Int. Cl.[7] .................. H01L 21/336; H01L 21/20; H01L 21/36; C30B 23/00
(52) U.S. Cl. .................. 438/300; 438/299; 438/303; 438/489
(58) Field of Search .................. 438/299–303, 438/471, 485–489, 518

(56) References Cited

U.S. PATENT DOCUMENTS

| | | |
|---|---|---|
| 6,063,675 A | 5/2000 | Rodder |
| 6,261,911 B1 | 7/2001 | Lee et al. |
| 6,303,450 B1 | 10/2001 | Park et al. |
| 6,326,664 B1 | 12/2001 | Chau et al. |
| 6,346,447 B1 * | 2/2002 | Rodder .................. 438/300 |
| 6,346,732 B1 | 2/2002 | Mizushima et al. |
| 6,376,318 B1 * | 4/2002 | Lee et al. .................. 438/300 |
| 6,403,434 B1 | 6/2002 | Yu |
| 6,406,951 B1 | 6/2002 | Yu |
| 6,406,973 B1 * | 6/2002 | Lee .................. 438/416 |
| 6,440,807 B1 | 8/2002 | Ajmera et al. |
| 6,465,313 B1 * | 10/2002 | Yu et al. .................. 438/300 |
| 6,489,206 B1 | 12/2002 | Chen et al. |
| 6,607,948 B1 | 8/2003 | Sugiyama et al. |
| 6,620,664 B1 | 9/2003 | Ma et al. |
| 6,657,223 B1 | 12/2003 | Wang et al. |
| 6,797,556 B1 * | 9/2004 | Murthy et al. .............. 438/231 |
| 2003/0136985 A1 * | 7/2003 | Murthy et al. .............. 257/288 |
| 2003/0139001 A1 * | 7/2003 | Snyder et al. .............. 438/197 |
| 2003/0146428 A1 | 8/2003 | Ma et al. |
| 2003/0162348 A1 | 8/2003 | Yeo et al. |
| 2003/0219971 A1 | 11/2003 | Cabral, Jr. et al. |
| 2003/0227029 A1 | 12/2003 | Lochtefeld et al. |
| 2004/0188760 A1 * | 9/2004 | Skotnicki et al. ........... 257/347 |

* cited by examiner

Primary Examiner—Shouxiang Hu
(74) Attorney, Agent, or Firm—Todd M. C. Li

(57) ABSTRACT

A planar NFET on a strained silicon layer supported by a SiGe layer achieves reduced external resistance by removing SiGe material outside the transistor body and below the strained silicon layer and replacing the removed material with epitaxial silicon, thereby providing lower resistance for the transistor electrodes and permitting better control over Arsenic diffusion.

13 Claims, 4 Drawing Sheets

STRAINED SILICON NMOS DEVICES WITH EMBEDDED SOURCE/DRAIN

BACKGROUND OF INVENTION

The field of the invention is that of integrated circuit fabrication, including CMOS transistors formed with strained silicon for higher mobility.

An important aim of ongoing research in the semiconductor industry is increasing semiconductor performance while decreasing the size of semiconductor devices. Planar transistors, such as metal oxide semiconductor field effect transistors (MOSFET) are particularly well suited for use in high-density integrated circuits.

Strained silicon technology allows the formation of higher speed devices. Strained-silicon transistors are created by depositing a graded layer of silicon germanium (SiGe) on a bulk silicon wafer. The top part of the SiGe layer is relaxed SiGe. A thin layer of silicon is subsequently deposited on the SiGe layer. The crystalline structure of SiGe is diamond which is the same as silicon (Si). The lattice constant in the SiGe is greater than that in Si. If the thickness of a strained Si or SiGe layer is smaller than a critical thickness, the stress in the strained layer can be maintained and dislocations are not generated. Therefore, when a thin silicon layer (thinner than critical thickness) is deposited on top of SiGe the silicon crystal lattice tends to stretch or "strain" to align the silicon atoms with the atoms in the SiGe layer. Electrons in the strained silicon experience less resistance and flow up to 80% faster than in unstrained silicon.

There are two general types of MOS transistors, N-channel MOS (NMOS) formed with n-type source and drain regions in a p-type region of silicon, and P-channel MOS (PMOS) formed with p-type source and drain regions in an n-type region of silicon. NMOS transistors conduct electrons through the transistor channel, while PMOS transistors conduct holes through the transistor channel. Typically, the source and drain regions of the transistors are doped with phosphorous or arsenic to form n-type source/drain regions, while boron doping is used to form p-type source/drain regions.

CMOS transistors, which comprise N- and P-channel MOS transistors on the same substrate, suffer from imbalance. The imbalance is due to electron mobility being greater than hole mobility in the channel region. Therefore, NMOS transistors are faster than PMOS transistors. Typically, NMOS transistors are about 2 to about 2.5 times faster than PMOS transistors.

A particular aspect of strained silicon NMOS transistors that have SiGe under the strained silicon is that the external resistance of an NMOS transistor is greater than the exterior resistance of a corresponding/conventional NMOS transistor.

Various approaches in circuit design have been developed to compensate for the difference in transistor operating speed or to exploit the higher speed of NMOS transistors.

There exists a need in the semiconductor device art to provide NMOS transistors on strained silicon that have external resistance that is closer to that of unstrained/conventional transistors. Experimental data show that a strained Si/SiGe NFET has larger external resistance than a conventional Si NFET, although the channel resistance of strained Si/SiGe NFET is smaller than that in a Si NFET. Therefore, a preferable structure for a high performance NFET is that of a strained Si channel with the source/drain and extension being formed in pure silicon. This gives both small external resistance and small channel resistance. Our invention provides structures and methods for making such NFETs.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising a semiconductor.

SUMMARY OF INVENTION

The invention relates to a structure and method of forming NFETs with a strained silicon channel and with external resistance as small as that in conventional Si NFET.

A feature of the invention is the provision of temporary gate spacers that prevent a strained silicon transistor channel from losing stress when the strained silicon outside the body is removed.

Another feature of the invention is the removal of part of the SiGe below the silicon in the S/D and/or extension area and replacement by silicon thereby reducing exterior resistance.

Another feature of the invention is undercutting the silicon below temporary gate spacers, thereby reducing the distance between the channel and the S/D electrode.

Another feature of the invention is the replacement of SiGe by silicon in areas that will reduce arsenic diffusion and be easier to form shallow junctions.

DETAILED DESCRIPTION

Figure 1:
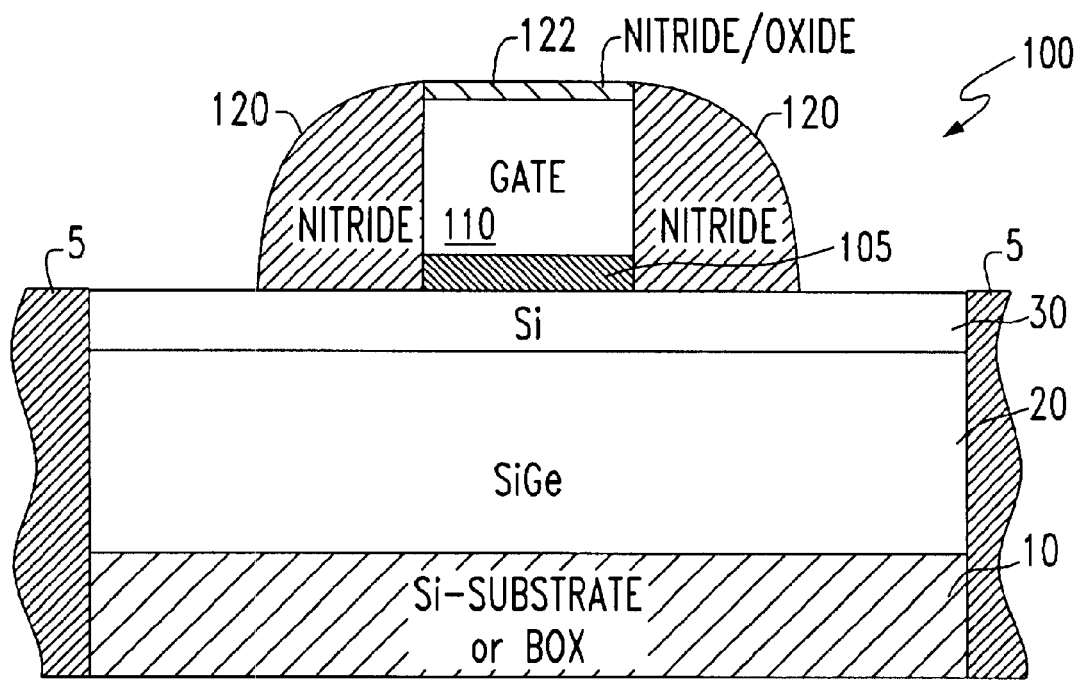
FIG. 1 shows a cross section of a NFET according to the invention after formation of the gate and before ion implantation.

FIG. 1 shows a cross section of an NFET under construction on a wafer having a lower section, which may be a bulk substrate 10 or a buried insulator (BOX) on a bulk substrate, both of the foregoing being denoted by numeral 10.

As is conventional, the bulk substrate is shown in the lower portion of the figures and the transistor is shown in the upper or top portion. Corresponding terms are used to describe the location of items in the Figures—i.e. the gate is above the transistor body, etc.

Above layer 10, a SiGe layer 20 has a nominal thickness of about 30 nm. Strained silicon layer 30 has a nominal thickness of about 15–25 nm. As discussed below, a S/D region having acceptable resistivity requires a thicker layer of silicon than is provided for by considerations of device construction.

A structure, denoted generally by numeral 100, will become an NFET transistor. A conventional gate dielectric 105, illustratively thermal oxide, has been grown on the top surface of silicon 30. A polycrystalline silicon (poly) gate 110 has been formed, with a pair of temporary nitride spacers 120 on either side of gate 110. A cap 122 protects gate 110 during preliminary steps.

The advantages of strained silicon for NFET performance enhancement are well known. It is also known that the external resistance of an NFET on thin strained silicon/SiGe substrate is greater than the corresponding value for an unstrained silicon substrate; in part because the resistivity of arsenic doped SiGe is greater than that in silicon.

In addition, Arsenic (As, the standard dopant) diffuses much faster in SiGe than in silicon, so that it is correspondingly difficult to form shallow and sharp p-n junctions and to control the concentration of As dopant at a given location. This last feature means that there is an increased risk of punch through and adverse short channel effects in a strained silicon NFET on a strained Si/SiGe substrate compared with a corresponding NFET on a conventional silicon substrate.

On the left and right of FIG. 1, a pair of isolation members 5 are shallow trenches filled with oxide (referred to as STI, for shallow trench isolation).

Figure 2:
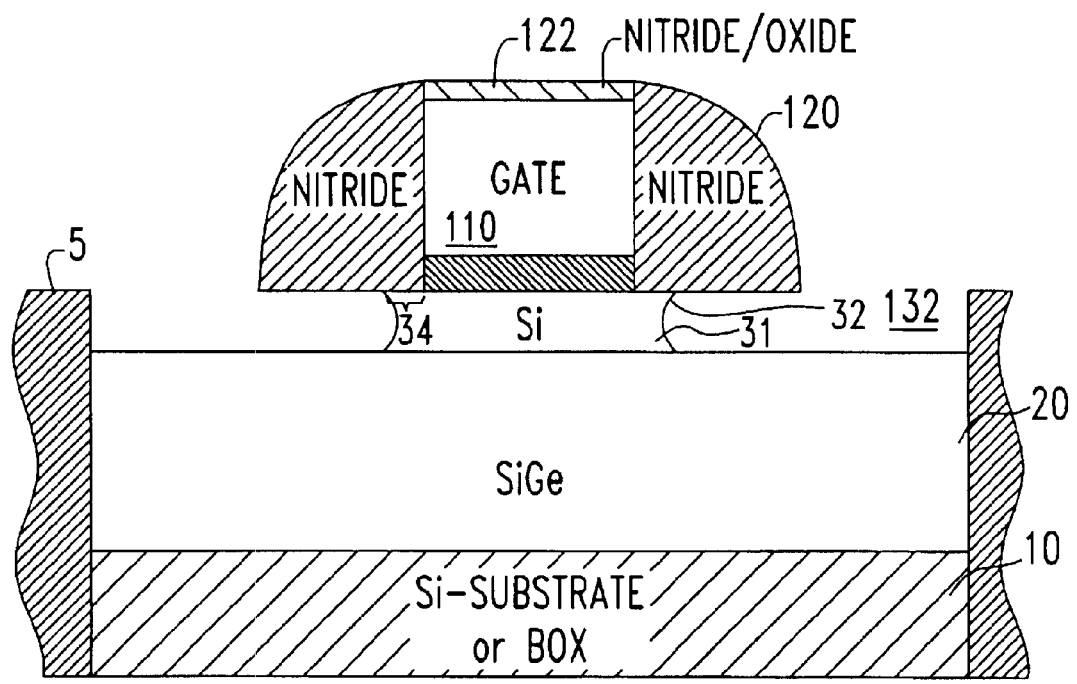
FIG. 2 shows a cross section of the same area after removal of strained silicon outside the transistor body.

FIG. 2 shows the result of applying a wet etch (e.g. KOH, which etches silicon selectively to SiGe) to silicon 30 and removing the strained silicon outside the transistor body for a length of time such that spacers 120 are undercut, leaving a vertical surface 32 at the edge of the strained transistor body 31. The term "substantially non-directional process" will be used in the following claims to denote both a wet etch and a dry etch that has a sufficiently large transverse component to undercut temporary spacers 120 to the required amount.

An advantage of the undercutting step in the process is that the distance between the channel and the S/D electrode is reduced, since the epi silicon that fills the undercut area is electrically part of the S/D electrode, whether it is doped during epi growth or by implantation after the formation of the material. This reduced distance translates into reduced exterior resistance.

This step opens a first S/D aperture 132 on both sides of the structure 100. Bracket 34 indicates the amount of silicon 30 remaining outside gate 110 after the etch. The magnitude of this remaining silicon, referred to as a buffer portion of silicon, is selected such that the mechanical strength of the attachment of the upper surface of the silicon to the material above it (gate oxide and nitride) is sufficient to prevent the strain in the silicon from relaxing.

Those skilled in the art will be aware that if the strain did relax, the performance advantage provided by the strained silicon would be lost. The bottom dimension of the spacers 120 therefore must be at least enough to cover the buffer portion of silicon.

Figure 3:
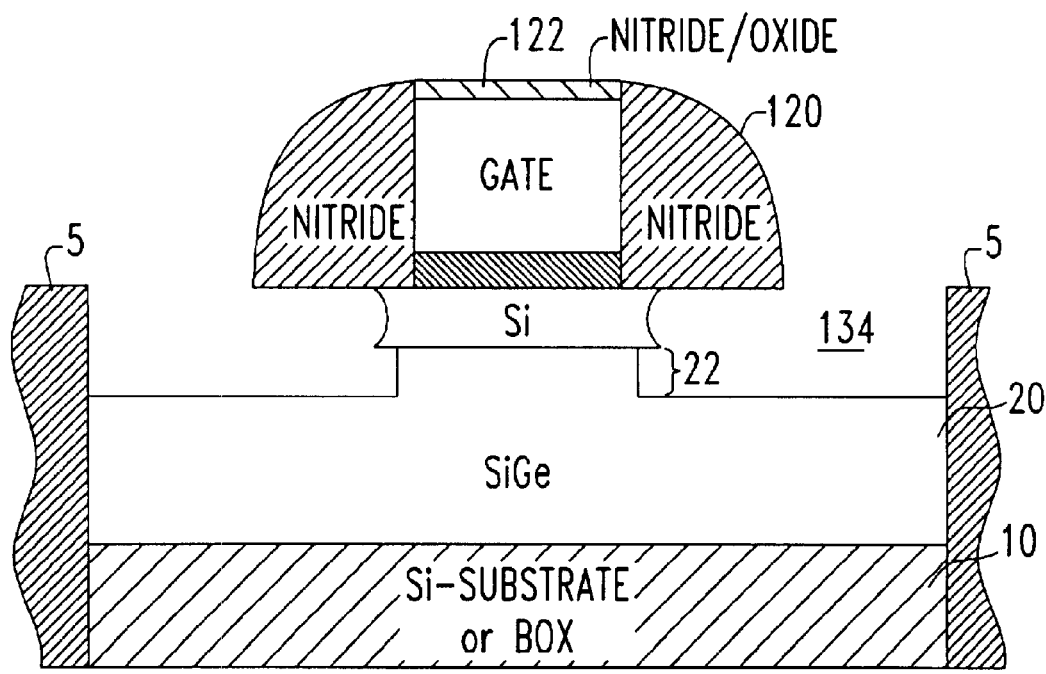
FIG. 3 shows the same area after removal of SiGe from the bottom of the aperture in the strained silicon.

FIG. 3 shows the result of the following step, in which a portion of the SiGe under the first S/D aperture is also removed, forming a second S/D aperture 134 having an additional depth indicated by bracket 22.

The thickness of silicon layer 30 is chosen to provide a good body for the final transistor and not for providing low external resistance. In contemporary technology, the maximum electrically active dopant concentration in the source and drain (i.e. the solubility limit) that will be formed outside the transistor body is not enough to lower the external resistance to a desired amount if only silicon 30 is used for the source and drain. Accordingly, the external resistance with the new structure can be reduced by removing a portion of the SiGe and substituting lower-resistance silicon.

Figure 4:
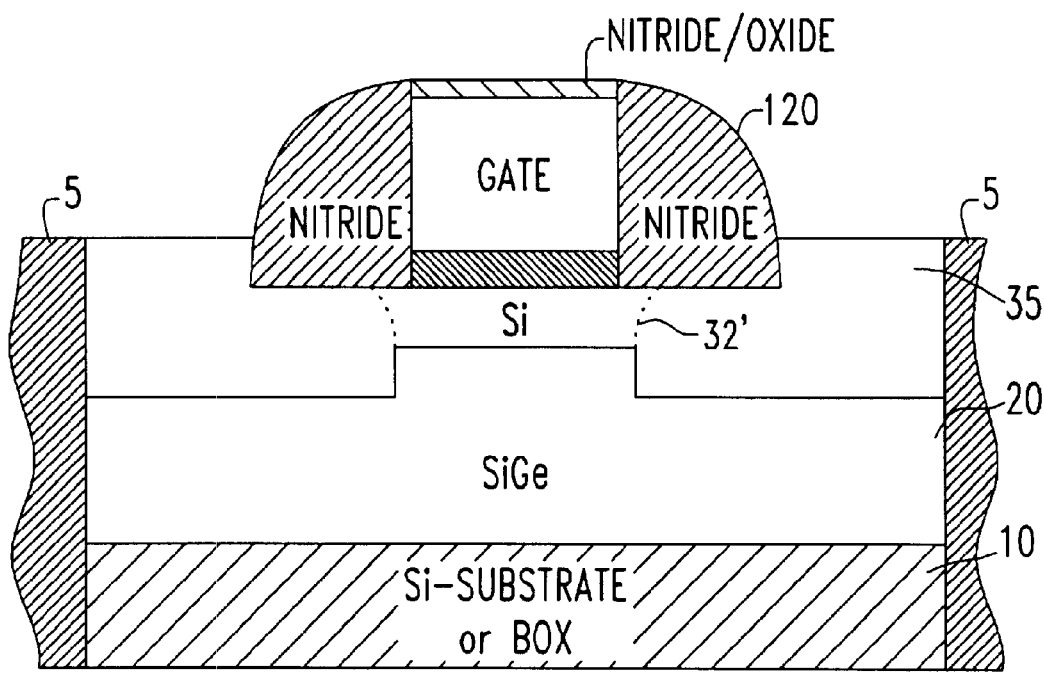
FIG. 4 shows the same area after filling the aperture with epitaxial silicon.

FIG. 4 shows the result of filling the first and second apertures by an epitaxially grown layer of silicon 35, referred to as an electrode layer. Epitaxial silicon (epi) is preferred because the material is of higher quality and because the grain boundaries of poly increase the resistance of poly fill. In some cases, poly may be suitable and epi is not always essential. Electrode layer 35 makes mechanical contact with the transistor body 31 to preserve the strain in the transistor channel. It also makes electrical contact with the transistor body, so that the electron carriers may flow from the electrodes in and out of the body. The boundary between the old silicon in the transistor body and the new silicon is indicated with a dotted line 32'.

FIG. 4 shows that the electrode layer of silicon has been deposited above the bottom of spacers 120, which mark the previous top surface of the wafer. This is not essential, but increases the cross section of silicon that carries the current, thereby reducing the external resistance. The structure shown in this example is therefore a raised source/drain structure.

Figure 5:
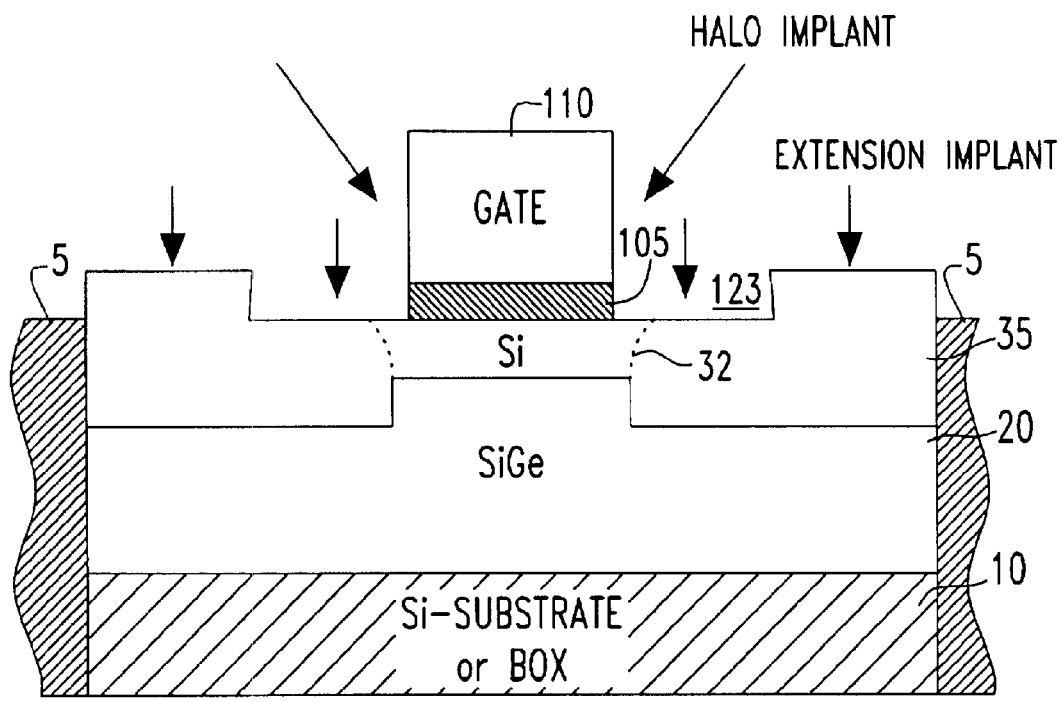
FIG. 5 shows the area after removal of the temporary spacers and halo and extension implantation.

FIG. 5 shows the result of stripping the temporary/disposable spacers 120 in hot phosphoric acid, leaving a pair of apertures 123, and implanting the halo and extension implants (referred to separately and together as the transition implants). The magnitude of the implant dose and the implanting voltage are conventional for the illustrated case. The halo implant (illustratively dose $\sim 1\times 10^{13}$–$1\times 10^{14}$/cm$^2$) is implanted at an angle, so that it penetrates under the gate dielectric, as is conventional. The extension implant (illustratively dose $\sim 3\times 10^{14}$–$1\times 10^{15}$/cm$^2$) is performed. An option may be, for example, that the correct dopant concentration for the extension area is provided during the epi growth step (or during gas phase doping) and only the halo implant is needed.

The cited U.S. Pat. No. 6,657,223 has to perform extension and halo implants before the Si in the SD areas is grown and with the gate electrode as the hardmask, in contrast to the presently disclosed process, in which the extension and halo implants are performed after the temporary spacers are removed and before the final spacers are formed.

The use of a disposable spacer is a significant advantage of the present process. Since the dopants are introduced (i.e., by implantation) into the extension and channel after Si epi growth (see FIG. 4), this can avoid the diffusion of the dopants due to thermal cycle of the Si epi growth. This can form shallower junctions than that proposed by U.S. Pat. No. 6,657,223 and thereby improve short channel effects.

Since As diffuses much less rapidly in silicon than in SiGe with a high percentage of Ge, the extension and SD implant are better controlled in transistors made according to the invention.

Figure 6:
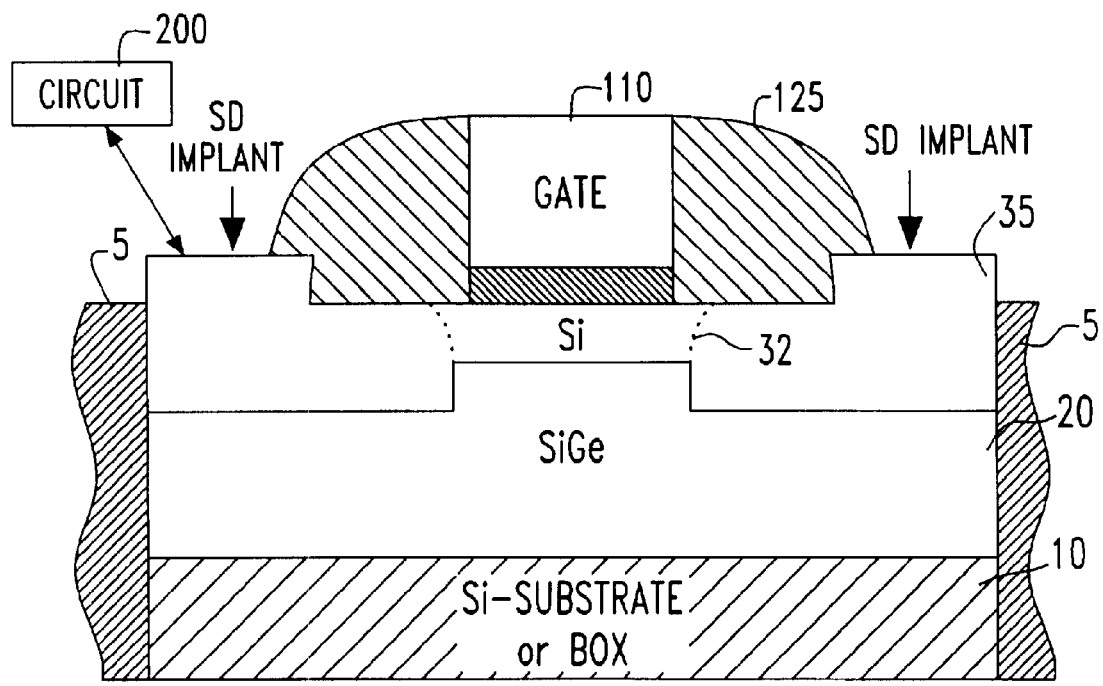
FIG. 6 shows the area after formation of spacers separating the source and drain from the gate and implantation of the source and drain.

FIG. 6 shows the result of depositing a second pair of gate spacers 125 that extend past the location of the temporary spacers in this example. It is not necessary that the final spacers be wider than the temporary spacers and the opposite may be the case—the final spacers may be narrower than the temporary spacers in order to reduce the distance between channel and S/D. Conventional S/D implants are made using the spacers as a mask. The energy of the S/D implants is chosen such that the vertical extent of the silicon 35 is doped, to provide the lowest resistance. With the configuration shown, the S/D and the extension are embedded in a pure Si layer.

Box 200 in FIG. 6 represents schematically other NFETs and PFETs that are connected together to form an integrated circuit.

Figure 7:
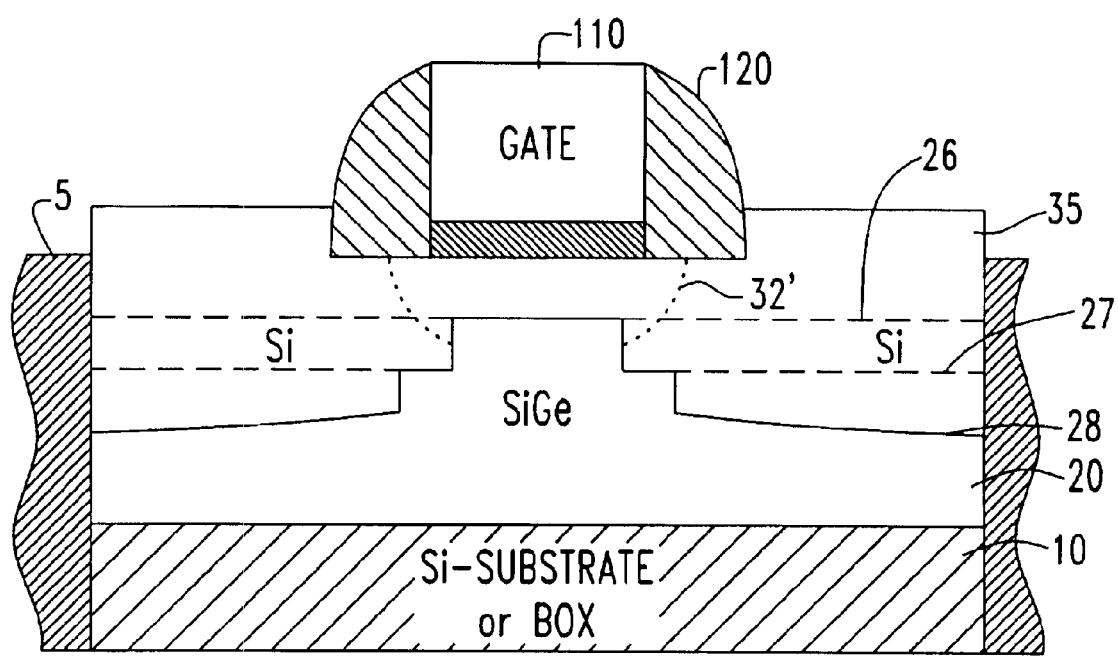
FIG. 7 shows the completed structure.

FIG. 7 shows an alternative example of the final structure in which a staircase silicon extension SD has been formed. This structure reduces stress relaxation in the strained Si channel compared with the structure of FIG. 6 and further reduces extension resistance.

The method to form this structure is, after formation of the spacer 120:

1) RIE silicon 30 stopping on SiGe;
2) wet etch SiGe 20 selective to Si to undercut SiGe under the Si, thereby extending the S/D aperture downward past line 26 to line 27;
3) RIE SiGe 20 to form the staircase of SiGe extending the aperture further down to line 28; and
4) epitaxial growth of Si to form the structure shown in FIG. 7.

After this step, one can remove the disposable spacer 120 to perform halo and extension implantation, form spacer, SD implantation, and SD annealing to activate dopant in the device. Line 32' represents the boundary between the original silicon 30 and the epi. Its location will vary according to the degree of directionality of the RIE etch and the degree to which the SiGe etch attacks Si. The requirement on the holding power of the material abutting the silicon 30—that it prevent relaxation of the stress in silicon 30 is the same as in the previous embodiment.

Those skilled in the art are aware that transistor structure is a compromise affected by many factors. The dopant concentration of the extension implant and the transverse (left-right in the Figure) dimension of the transistor will affect its electrical performance, as well as its external resistance. The transverse dimension will also affect the chance of a short developing between one of the S/D and the gate, so that the available reduction in external resistance is limited by a requirement of a minimum distance between the transistor channel and the S/D, as well as other factors.

Although the prior art cited U.S. Pat. No. 6,657,223 is directed at reducing junction leakage in the bulk wafer example shown in that patent, leakage is actually an advantage in a circuit constructed on a SOI wafer. Since SOI transistors have floating bodies, junction leakage can reduce the need for a body contact, thus saving space.

The embodiment of FIG. 7 also has the advantage over the previous embodiment of FIG. 6 that by undercutting the temporary spacers, the distance between the channel and the S/D can be reduced and therefore that the external resistance can correspondingly be reduced.

Various choices may be made to use alternative materials from those illustrated, such as oxide spacers, oxy-nitride gate dielectric, silicide for the S/D area and the like.

While the invention has been described in terms of a single preferred embodiment, those skilled in the art will recognize that the invention can be practiced in various versions within the spirit and scope of the following claims.

What is claimed is:

1. A method of forming an NFET having a strained silicon transistor body in a layer of strained silicon, having a strained silicon layer thickness, disposed on a support layer of SiGe alloy, comprising the steps of:

forming a gate dielectric over said strained silicon transistor body;

forming a gate electrode over said gate dielectric;

forming a pair of temporary dielectric spacers on opposite sides of said gate electrode;

removing said strained silicon outside said transistor body and below said pair of temporary spacers by a substantially non-directional process, leaving a buffer portion of strained silicon in said strained silicon layer and a first S/D aperture outside said buffer portion;

forming an electrode layer of silicon in said first S/D aperture, making mechanical and electrical contact with said transistor body and with a portion of said support layer of SiGe below said first S/D aperture;

forming transition doped areas between said transistor body and electrode areas in said electrode layer on opposite sides of said transistor body; and forming transistor electrodes in said electrode areas.

2. A method according to claim 1, further comprising a step of:

removing said pair of temporary dielectric spacers after said step of forming said electrode layer of silicon in said first aperture; and forming said transition doped areas by implanting dopants in said electrode layer of silicon.

3. A method according to claim 2, further comprising a step of:

removing SiGe alloy from said support layer below said S/D aperture, thereby extending said first S/D aperture vertically downward to form a second S/D aperture; and forming said electrode layer of silicon in said second aperture with an electrode layer thickness greater than said strained silicon layer thickness.

4. A method according to claim 1, in which said temporary spacers have a thickness abutting said strained silicon layer such that said buffer portion of strained silicon in said strained silicon layer has sufficient mechanical strength to maintain stress in said strained silicon body after said first aperture is formed.

5. A method according to claim 4, further comprising a step of:

removing said pair of temporary dielectric spacers after said step of forming said electrode layer of silicon in said first aperture; and forming said transition doped areas by implanting dopants in said electrode layer of silicon.

6. A method according to claim 5, further comprising a step of:

removing SiGe alloy from said support layer below said S/D aperture, thereby extending said first S/D aperture vertically downward to form a second S/D aperture; and forming said electrode layer of silicon in said second aperture with an electrode layer thickness greater than said strained silicon layer thickness.

7. A method according to claim 1, further comprising a step of:

removing SiGe alloy from said support layer below said S/D aperture, thereby extending said first S/D aperture vertically downward to form a second S/D aperture; and forming said electrode layer of silicon in said second aperture with an electrode layer thickness greater than said strained silicon layer thickness.

8. A method according to claim 7, further comprising a step of:

after said step of forming said transition doped areas, forming a pair of spacers between said gate electrode and source and drain areas in said electrode layer of silicon on opposite sides of said gate electrode and forming source and drain electrodes in said source and drain areas.

9. A method according to claim 8, in which said temporary spacers have a thickness abutting said strained silicon layer such that said buffer portion of strained silicon in said strained silicon layer has sufficient mechanical strength to maintain stress in said strained silicon body after said first aperture is formed.

10. A method according to claim 1, in which said electrode layer of silicon is formed in said second aperture up to at least the level of said gate dielectric.

11. A method according to claim 10, in which said temporary spacers have a thickness abutting said strained silicon layer such that said buffer portion of strained silicon in said strained silicon layer has sufficient mechanical strength to maintain stress in said strained silicon body after said first aperture is formed.

12. A method according to claim 11, further comprising a step of:
 removing said pair of temporary dielectric spacers after said step of forming said electrode layer of silicon in said first aperture; and
 forming said transition doped areas by implanting dopants in said electrode layer of silicon.

13. A method according to claim 12, further comprising a step of:
 removing SiGe alloy from said support layer below said S/D aperture, thereby extending said first S/D aperture vertically downward to form a second S/D aperture; and
 forming said electrode layer of silicon in said second aperture with an electrode layer thickness greater than said strained silicon layer thickness.

* * * * *